(12) United States Patent
Ghosh et al.

(10) Patent No.: US 7,238,383 B2
(45) Date of Patent: *Jul. 3, 2007

(54) MAKING AND USING COMPACTED PELLETS FOR OLED DISPLAYS

(75) Inventors: Syamal K. Ghosh, Rochester, NY (US); Donn B. Carlton, Hamlin, NY (US); Tukaram K. Hatwar, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 451 days.

This patent is subject to a terminal disclaimer.

(21) Appl. No.: 10/384,290

(22) Filed: Mar. 7, 2003

(65) Prior Publication Data

US 2004/0173929 A1  Sep. 9, 2004

(51) Int. Cl.
  *B05D 5/06* (2006.01)
(52) U.S. Cl. .................. 427/66; 427/255.23; 427/294
(58) Field of Classification Search ............ 427/248.1, 427/255.23, 255.21, 255.14, 255.19
See application file for complete search history.

(56) References Cited

U.S. PATENT DOCUMENTS

| | | | |
|---|---|---|---|
| 3,699,374 A * | 10/1972 | Scholl et al. ............... 313/525 |
| 4,356,429 A | 10/1982 | Tang | |
| 4,539,507 A | 9/1985 | VanSlyke et al. | |
| 4,620,081 A * | 10/1986 | Zeren ................. 219/121.15 |
| 4,720,432 A | 1/1988 | VanSlyke | |
| 4,769,292 A | 9/1988 | Tang et al. | |
| 5,550,066 A | 8/1996 | Tang et al. | |
| 5,552,547 A * | 9/1996 | Shi .............................. 546/7 |
| 6,237,529 B1 | 5/2001 | Spahn | |
| 6,649,436 B2 | 11/2003 | Ghosh et al. | |
| 6,797,314 B2 * | 9/2004 | Van Slyke et al. ............ 427/66 |
| 6,967,182 B1 * | 11/2005 | Olsbye et al. ................ 502/84 |
| 2003/0008071 A1 * | 1/2003 | Van Slyke et al. ....... 427/255.28 |
| 2003/0161959 A1 * | 8/2003 | Kodas et al. ............ 427/376.2 |

FOREIGN PATENT DOCUMENTS

| | | |
|---|---|---|
| JP | 02-042421 | 2/1990 |
| JP | 05214516 A * | 8/1993 |
| JP | 11-092915 | 4/1999 |
| JP | 2000-252061 | 9/2000 |

OTHER PUBLICATIONS

"27.2: Linear source Deposition of Organic Layers for Full-Color OLED" by Steven VanSlyke et al., SID 2002 Digest, pp. 886-889.

* cited by examiner

*Primary Examiner*—Keith Hendricks
*Assistant Examiner*—Jimmy Lin
(74) *Attorney, Agent, or Firm*—Raymond L. Owens

(57) ABSTRACT

A method of forming a compacted pellet of organic materials adaptable for making an organic layer on a structure which will form part of an OLED display, includes providing a sublimable organic material in a powder form; providing a thermally insulating and non-sublimable inorganic material in a powder form; forming a mixture of the sublimable organic powder and thermally insulating and non-sublimable inorganic powder; placing such mixture into a die and using two punches, a lower and an upper punch, to apply sufficient pressure to the mixture to cause the mixture of powders to consolidate into a solid pellet; applying heat to the die during or prior to applying pressure by the opposing punches to aid in causing the mixture of powders to consolidate into a solid compacted pellet, and removing the pellet from the die.

4 Claims, 4 Drawing Sheets

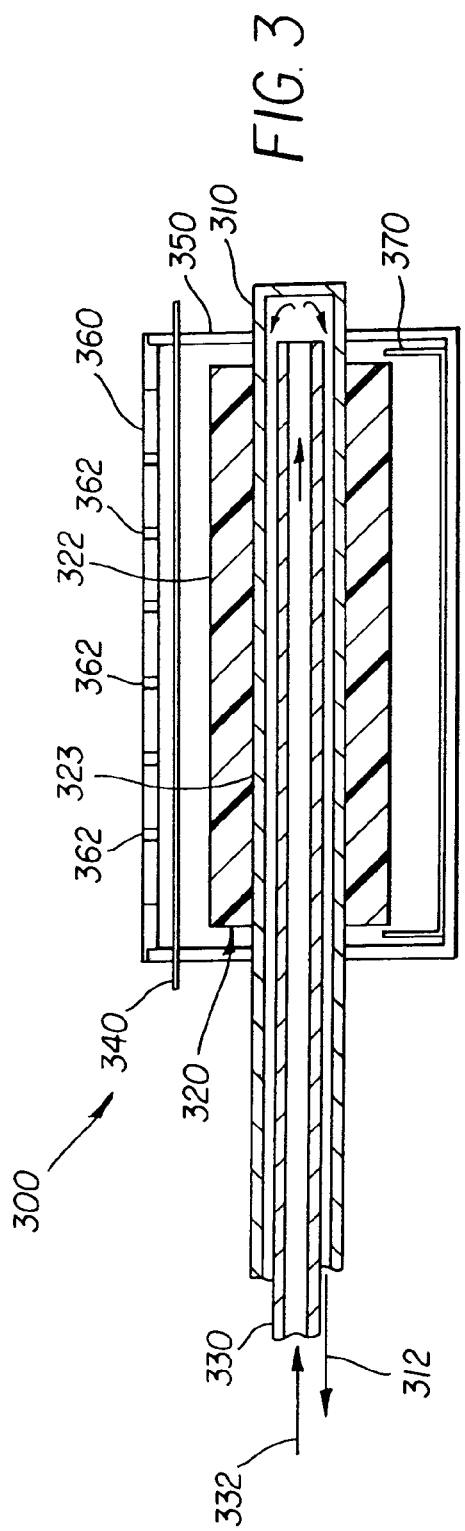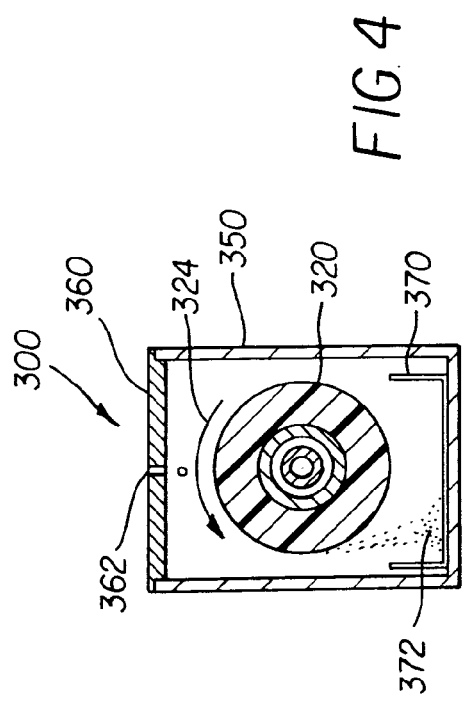

MAKING AND USING COMPACTED PELLETS FOR OLED DISPLAYS

CROSS REFERENCE TO RELATED APPLICATIONS

Reference is made to commonly assigned U.S. patent application Ser. No 09/898,369 filed Jul. 3, 2001 entitled "Method of Handling Organic Material in Making An Organic Light-Emitting Device" by Van Slyke et al; U.S. patent application Ser. No. 10/073,690 filed Feb. 11, 2002, entitled "Using Organic Materials in Making An Organic Light-Emitting Device" by Ghosh et al, U.S. patent application Ser. No. 10/195,947 filed Jul. 16, 2002, entitled "Compacting Moisture-Sensitive Organic Material in Making An Organic Light-Emitting Device" by Ghosh et al, U.S. patent application Ser. No. 10/226,600 filed Aug. 23, 2002, entitled "Solid Compacted Pellet of Organic Material for Vacuum Deposition of OLED displays and Method of Making Same" by Ghosh et al, and U.S. patent application Ser. No. 10/348,118 filed Jan. 17, 2003, entitled "Using Compacted Organic Materials In Making White Light Emitting OLEDS" by Ghosh et al, the teachings of which are incorporated herein.

FIELD OF THE INVENTION

The present invention relates generally to an improved method of consolidating organic materials to a pellet and for using such pellets for making an organic layer on a substrate which will form a part of an OLED display.

BACKGROUND OF THE INVENTION

An organic light-emitting diode (OLED), also referred to as an organic electroluminescent device, can be constructed by sandwiching two or more organic layers between first and second electrodes.

In a passive-matrix OLED of conventional construction, a plurality of laterally spaced light-transmissive anodes, for example indium-tin-oxide (ITO) anodes, are formed as first electrodes on a light-transmissive substrate such as, for example, a glass substrate. Two or more organic layers are then formed successively by physical vapor deposition of respective organic materials from respective sources, within a chamber held at reduced pressure, typically less than $10^{-3}$ Torr. A plurality of laterally spaced cathodes is deposited as second electrodes over an uppermost one of the organic layers. The cathodes are oriented at an angle, typically at a right angle, with respect to the anodes.

Such conventional passive-matrix OLED displays are operated by applying an electrical potential (also referred to as a drive voltage) between appropriate columns (anodes) and, sequentially, each row (cathode). When a cathode is biased negatively with respect to an anode, light is emitted from a pixel defined by an overlap area of the cathode and the anode, and emitted light reaches an observer through the anode and the substrate.

In an active-matrix OLED, an array of anodes is provided as first electrodes by thin-film transistors (TFTs) which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in commonly-assigned U.S. Pat. No. 5,550,066, the disclosure of which is herein incorporated by reference.

Organic materials, thickness of vapor-deposited organic layers, and layer configurations, useful in constructing an organic light-emitting device, are described, for example, in commonly-assigned U.S. Pat. Nos. 4,356,429; 4,539,507; 4,720,432; and 4,769,292, the disclosures of which are herein incorporated by reference.

Organic materials useful in making OLED displays, for example organic hole-transporting materials, organic light-emitting materials predoped with an organic dopant, and organic electron-transporting materials can have relatively complex molecular structures with relatively weak molecular bonding forces, so that care must be taken to avoid decomposition of the organic material(s) during physical vapor deposition.

The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a substrate to provide an organic layer thereon.

Several problems have been observed in using organic powders, flakes, or granules in physical vapor deposition:

(i) powders, flakes, or granules are difficult to handle because they can acquire electrostatic charges via a process referred to as triboelectric charging;

(ii) powders, flakes, or granules of organic materials generally have a relatively low physical density (expressed in terms of weight per unit volume) in a range from about 0.05 to about 0.2 $g/cm^3$, compared to a physical density of an idealized solid organic material of about 1 $g/cm^3$;

(iii) powders, flakes, or granules of organic materials have an undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; and (iv) powders, flakes, or granules can have a relatively high ratio of surface area/volume of such particles and a correspondingly high propensity to entrap air and/or moisture between particles under ambient conditions. Consequently, a charge of organic powders, flakes, or granules loaded into a physical vapor deposition source which is disposed in a chamber must be thoroughly outgased by preheating the source once the chamber has been evacuated to a reduced pressure. If outgasing is omitted or is incomplete, particles can be ejected from the source together with a vapor stream during physical vapor-depositing an organic layer on a structure. An OLED, having multiple organic layers, can be or can become functionally inoperative if such layers include particles or particulates. Compaction of organic materials for making OLED displays using a physical vapor deposition method is described by Van Slyke et al in a commonly assigned U.S. Patent Application Publication No. 2003/0008071 A1 the disclosure of which is incorporated herein by reference.

Each one, or a combination, of the aforementioned aspects of organic powders, flakes, or granules can lead to nonuniform heating of such organic materials in physical vapor deposition sources with attendant spatially nonuniform sublimation or vaporization of organic material and can, therefore, result in potentially nonuniform vapor-deposited organic layers formed on a structure.

The design and performance of linear evaporation source for organic materials are described by Steven Van Slyke et al, SID 2002 Digest, pp. 886–889, 2002. The organic material in powder form is placed inside a quartz boat and heated simultaneously by a bottom and a top heater. The bottom heater is used primarily to degas the powder and the top heater is operated at a temperature sufficient to vaporize the upper surface of the organic powder by radiative heating. The linear source provides significant advantages over the conventional point source, especially thickness uniformity over a large surface area of deposition.

Source design for thermal physical vapor-deposition of organic materials useful in constructing OLED displays, is described by R. Spahn in commonly-assigned U.S. Pat. No. 6,237,529, the disclosure of which is herein incorporated by reference.

SUMMARY OF THE INVENTION

It is an object of the present invention to provide an improved method of compacting organic material into pellets and using such pellets for depositing an emission layer for making an OLED display.

It is another object of the present invention to provide a method of compacting organic powder into a solid compacted pellet.

It is a further object of the invention to provide a method of making an organic layer from a solid compacted pellet of organic material and on a substrate which will form part of an OLED display.

It is still a further object of the present invention to provide a method of compacting a mixture of sublimable organic powder and a thermally insulating and non-sublimable inorganic powder into a solid compacted pellet.

In one aspect, the present invention provides a method of forming a solid compacted pellet of organic materials adaptable for making an organic layer on a structure which will form part of an OLED display, comprising the steps of:

(a) providing a sublimable organic material in a powder form;

(b) providing a thermally insulating and non-sublimable inorganic material in a powder form;

(c) forming s mixture of the sublimable organic powder and thermally insulating and non-sublimable inorganic powder;

(d) placing such mixture into a die and using two punches, a lower and an upper punch, to apply sufficient pressure to the mixture to cause the mixture of powders to consolidate into a solid pellet;

(e) applying heat to the die during or prior to applying pressure by the opposing punches to aid in causing the mixture of powders to consolidate into a solid compacted pellet, and (f) removing the compacted pellet from the die.

In another aspect, the present invention provides a method of making an OLED display wherein emission layer is deposited using a compacted cylindrical pellet of organic materials comprising the steps of:

(a) providing a compacted cylindrical pellet of organic material including a mixture of at least one host and one dopant along with non-sublimable and thermally insulating inorganic material;

(b) placing such a compacted cylindrical pellet inside a receptacle disposed in a physical vapor deposition chamber;

(c) positioning a substrate of a partially formed OLED device in the physical vapor deposition chamber in a spaced relationship with respect to the receptacle;

(d) evacuating the physical deposition chamber to a reduced pressure;

(e) applying heat to a surface of the compacted cylindrical pellet of organic material by electrically energizing the heater disposed in the evaporation source to cause at least a portion to sublime to provide a mixture of vapors of the organic materials including the host and the dopant(s) to form an emission layer on the substrate; and (f) rotating the compacted cylindrical pellet after a certain instant in order to expose a fresh portion of organic materials on the pellet to the heater and discarding the non-sublimable and thermally insulating inorganic material during the process of rotation.

A feature of the present invention is that a solid compacted pellet of organic material can be compacted by the method of the invention wherein at least one organic OLED material and at least one thermally insulating inorganic material are mixed prior to the compaction process to improve the thermal properties and physical strength.

Another feature of the present invention is that a solid compacted pellet of an OLED material can be made by the method of the present invention wherein a powder of at least one OLED host material and a powder of at least one organic dopant material are mixed or blended to provide a mixture prior to compacting the mixture into a solid compacted pellet of organic material.

Another feature of the present invention is that a solid compacted pellet of organic material including a host and one or more organic dopants eliminates the need of co-evaporation which require more than one evaporation source disposed inside a vacuum chamber.

Another beneficial feature of the present invention is that the solid compacted pellet of organic material is cooled at the center and a small fraction of the rotating surface is heated at a given instant thereby causing uniform deposition and homogeneous composition of the organic layers.

BRIEF DESCRIPTION OF THE DRAWINGS

FIGS. 2A–2F schematically indicate a sequence of process steps for forming a solid pellet from a mixture of organic and ceramic powders in a die disposed in a uniaxial press in accordance with the present invention, wherein:

FIG. 2A shows the die having organic and ceramic powder mixture filled inside a die cavity over a lower punch;

FIG. 2B shows an upper punch positioned into the die cavity and contacting an upper surface of the powder material;

FIG. 2C shows pressure being applied by the uniaxial press to the upper and lower punches to cause the organic and ceramic powder mixture material to consolidate into a solid pellet;

FIG. 2D shows the upper punch removed from the die cavity;

FIG. 2E shows the die removed from the press and the lower punch removed from the die cavity, with the pellet shown clinging to side surfaces of the die cavity; and FIG. 2F depicts a pellet plunger useful for removing the pellet from the die and capturing the pellet in a compliant container;

FIG. 3 depicts a cross-sectional view of a cylindrical compacted pellet having a cooling tube extended through its center for use in making an OLED display;

FIG. 4 depicts a cross-sectional end view of the cylindrical compacted pellet of FIG. 3;

The term "powder" is used herein to denote a quantity of individual particles, which can be flakes, granules, or mixtures of varied particles and shapes comprising single or plurality of molecular species.

DETAILED DESCRIPTION OF THE INVENTION

Figure 1:
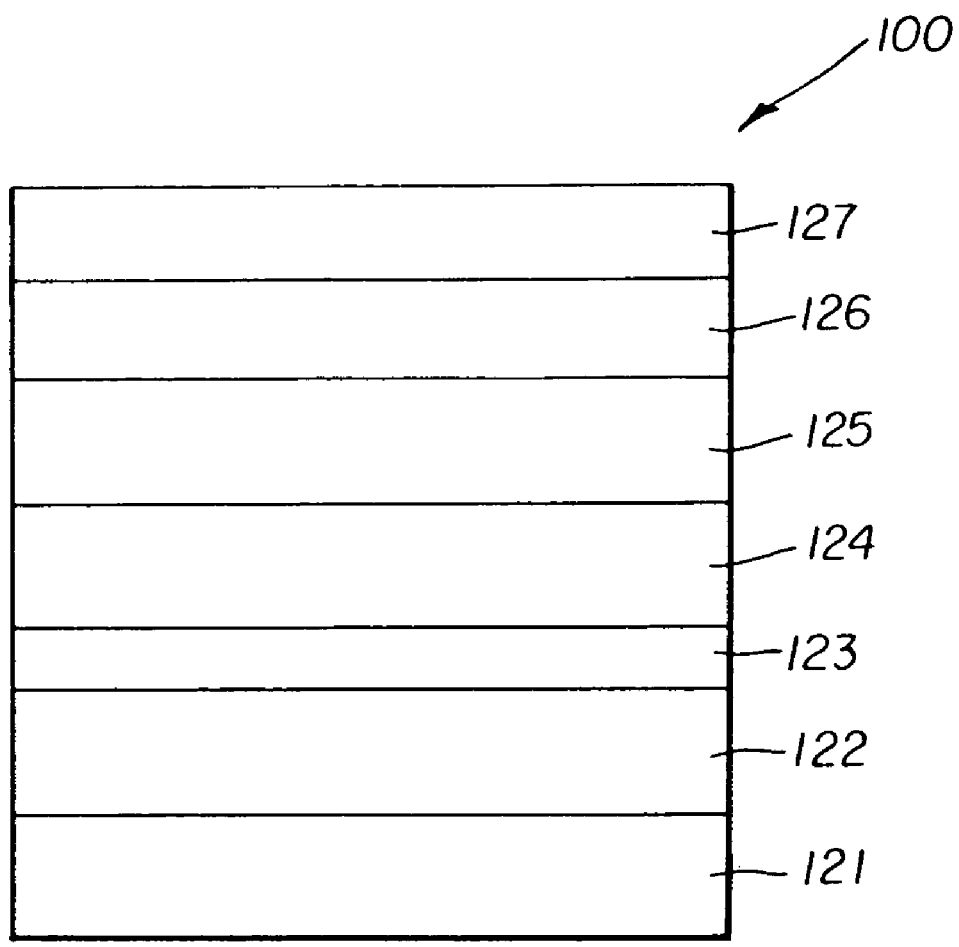
FIG. 1 depicts a prior art OLED.

The organic layers of an OLED display include an organic or organo-metallic material that produces light, known as electroluminescence (EL), as a result of electron-hole recombination in the layer. Hereinafter, the term "organic" will be taken to include both purely organic as well as organo-metallic materials. The organic layers of an OLED include an organic or organo-metallic material that produces light, known as electroluminescence (EL), as a result of electron-hole recombination in the layer. Hereinafter, the term "organic" will be taken to include both purely organic as well as organo-metallic materials. Turning to FIG. 1, a detailed structure of an OLED 100 of the prior art is shown, wherein an emission layer (EML) 125 is situated between a hole-transport layer (HTL) 124 and an electron-transport layer (ETL) 126. Each of these layers is composed predominantly of organic materials. The two transport layers 124 and 126 deliver holes from an anode 122 and electrons from a cathode 127, respectively, to the emission layer 125. An optional hole injection layer 123 facilitates the injection of holes from the anode 122 to the HTL 124. The emission layer 125 functions as the primary site for electron-hole recombination and emission of the resulting electroluminescent (EL) light. In this respect, the functions of the individual organic layers are distinct and therefore can be optimized independently. Thus, the emission layer 125 can be optimized for a desirable EL color and high luminance efficiency. A substrate 121 provides mechanical support for the OLED 100 and for electrical leads connecting the OLED 100 to a source of electric current. Layers 122 through 127 together along with the substrate 121 comprise the OLED 100. Either the cathode 127 or both the anode 122 and the substrate 121, are transparent to the EL light.

When an electrical potential difference (not shown) is applied between the anode 122 and the cathode 127, the cathode 127 injects electron into the HTL 124, and they migrate across that layer to the emission layer 125. At the same time, holes are injected from the anode 122 into the HTL 124, and they migrate across that layer to the emission layer 125. The holes and electrons recombine in the emission layer 125, frequently near the junction between the HTL 124 and the emission layer 125. Part of the energy released by the recombination process is emitted as electroluminescence which escapes through the transparent anode or cathode and/or the substrate.

Turning to FIG. 2A–2F, a sequence of process steps is indicated schematically for forming a solid pellet 313p of organic materials. A uniaxial press 200 includes a fixed platform 212 and a movable platform 214 mounted on posts 216. Movable platform 214 can be driven by hydraulic means or a combination of hydraulic and air or mechanical means (not shown) and supports a die 220 and a lower punch 222.

Figure 2C:
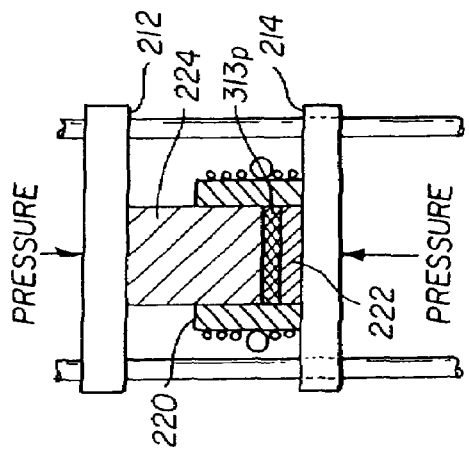
Figure 2F:
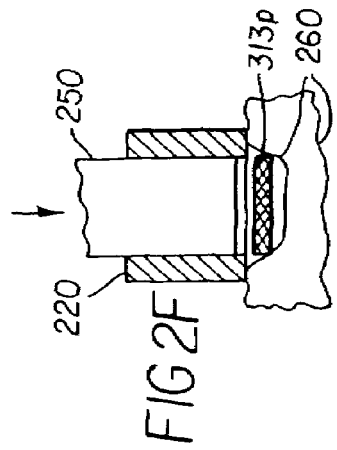
Figure 2B:
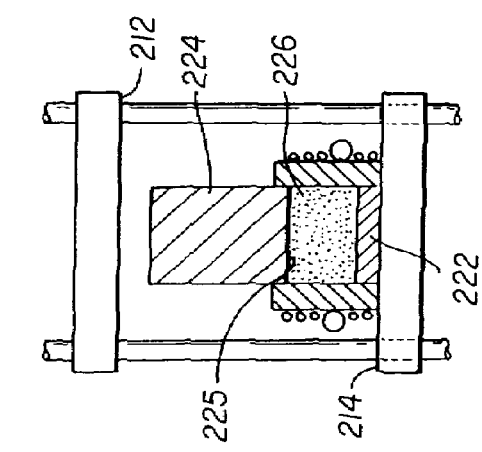
Figure 2E:
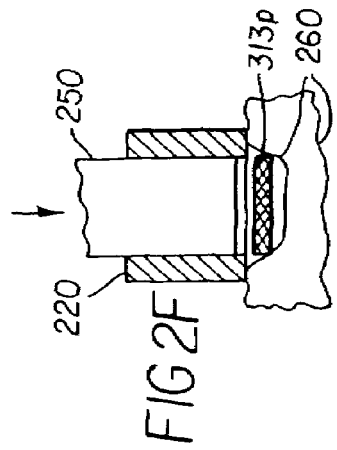
Figure 2A:
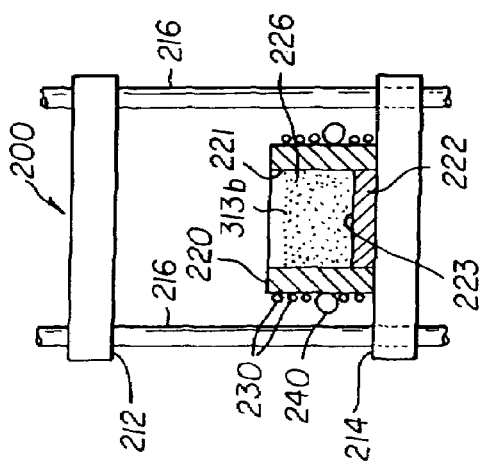

In FIG. 2A, organic powder 313a is filled in the die cavity 226 to a fill level 313b over the lower punch 222. The term "organic powder" used in this disclosure refers to materials in the form of powder, flakes, particulates or granules of organic hole-transporting material or organic electron transporting or organic emission material and those organic materials mixed with thermally insulating and non-sublimable inorganic material includes:

(a) zirconia; or
(b) alumina, or
(c) silica, or
(d) titania, or
(e) magnesia, or mixtures thereof Organic materials are mixed with highly thermally insulating and non-sublimable inorganic materials as described hereinbefore in order to control the thermal property of the compacted organic material so that the heat is confined primarily on the top surface while maintaining the bottom surface at least 100° C. below that of the top surface. Heating coils 230 heat the die 220 from an ambient temperature of about 20° C. to a temperature of about 300° C., and at least one cooling coil 240 can cool the die 220 relatively rapidly, for example from a temperature of 300° C. to a temperature of 50° C. or to an ambient temperature. The die 220 can also be heated inductively.

In FIG. 2B, an upper punch 224 is positioned in the die cavity 226 to contact an upper surface (the fill-level 313b) of the organic powder 313a.

The interior surface 221 of the die 220 is a polished surface, and at least the surface 223 of the lower punch 222 and the surface 225 of the upper punch 224 are polished surfaces. Taken together, the die 220 and the lower and upper punches 222 and 224 are also referred to as a die in portions of this disclosure.

In FIG. 2C, the movable platform 214 is shown driven upwardly in a direction towards the fixed platform 212, and pressure is applied by the upper and lower punches 224, 222 respectively. The uniaxial press 200, which applies pressure in only one direction, acts on the upper punch 224 and the lower punch 222 so that such upper and lower punches (224 and 222, respectively) together apply pressure to cause the organic material 313a in the die 226 to consolidate into a solid pellet 313p. Compaction pressure applied by the uniaxial press 200 varied between 2,000 and 15,000 psi, more preferably between 3,000 and 8,000 psi to obtain high density solid pellets. The punches 222 and 224 are preposition inside the die 220 to form a cavity predetermined to contain the correct volume of OLED powder to achieve the required solid dimension after consolidation.

Figure 2D:
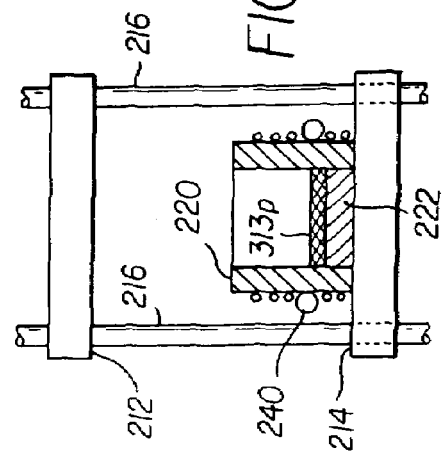

In FIG. 2D, the movable platform 214 has been lowered and the upper punch 224 has been removed from the die 220. The die 220 can be heated during or prior to applying pressure by the opposing punches 224, 222. This is true so long as the heated mixture of particles aids in causing the mixture of powders to consolidate into a solid pellet. If the die 220 was heated prior to or during formation of the solid pellet 313p, the upper punch 224 is removed from the die upon cooling to a temperature in a range from 20° C. to 80° C. via the at least one cooling coil 240.

In FIG. 2E, the die 220 is shown removed from the uniaxial press 200, and the lower punch 222 is removed from the die 220. For illustrative purposes only, the organic solid pellet 313p depicted clinging to the interior surface 221 of the die 220.

In FIG. 2F, a pellet plunger 250 is used for removing the solid pellet 313p from the die 220. The solid pellet 313p is captured in a compliant container 260 to minimize damage to the solid pellet 313p.

Heating the die 220 prior to or during application of pressure in the uniaxial press 200 can provide increased densification of a solid pellet 313p during a shortened interval of pressure application or, alternatively, at a lower pressure. A preferred range of die temperature extends from 50° C. to 300° C. The die temperature is generally maintained below the glass transition temperature, Tg, of the organic materials which will form the solid pellet 313p. The die 220 is cooled to a preferred temperature in a range from 80° C. to 20° C. prior to removing the solid pellet 313p from the die 220 and preferably prior to removing the upper punch 224 from the die 220.

A removable shroud (not shown) can be used to surround the lower punch 222, the die 220, and at least a portion of the upper punch 224. The shroud, and thus the elements enclosed by it, can be evacuated to a reduced pressure. Alternatively, an inert gas can be introduced into the shroud to provide an inert, i.e., a chemically non-reactive, atmosphere within the shroud so that the organic powder (e.g., 313a) and the solid pellet (e.g. 313p) formed therefrom are protected from decomposition in cases where the die 220 is heated to a temperature of up to 300° C. This is also helpful for organic powders which are very susceptible to moisture because it can be trapped inside the pellet 313p during the consolidation process.

The punch surfaces 223 and 225 can be planar surfaces. Alternatively, the surface 223 of the lower punch 222, or the surface 225 of the upper punch 224 can be a concave surface, or both surfaces 223 and 225 can have a concave shape, so that a solid pellet will have, respectively, co-planar major surfaces, one planar major surface and one convex major surface, or two convex major surfaces.

Figure 5:
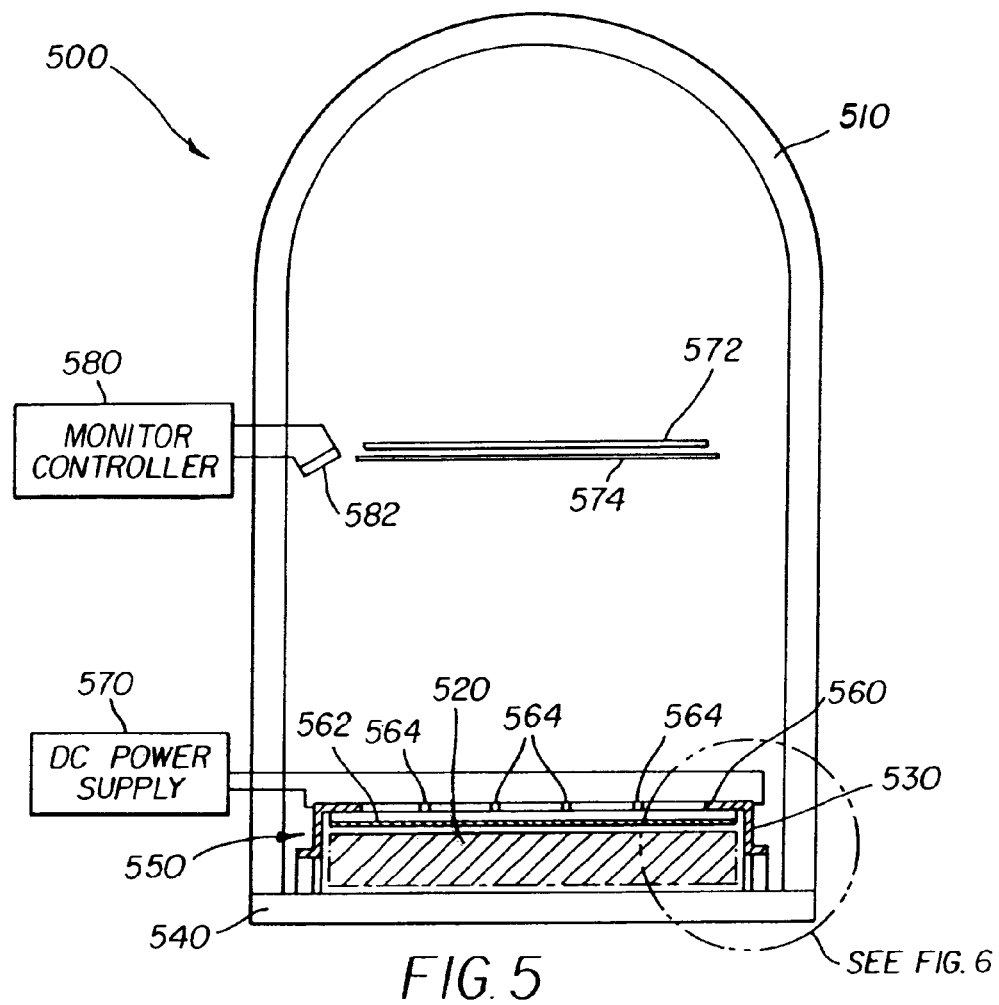
FIG. 5 depicts the schematic representation of a physical vacuum deposition chamber for making OLED displays using the compacted organic material mixed with thermally insulating inorganic material as an evaporation source according to the invention.

FIGS. 3–5 show apparatus for using compacted pellets made in accordance with the invention for depositing an emission layer in making an OLED display. Turning to FIG. 3, there is shown a cross-sectional view of an evaporation source 300 for evaporating organic materials according to the invention. A compacted cylindrical pellet 320 including organic material mixed with non-sublimable thermally insulating inorganic material is nested inside a refractory receptacle 350. The compacted cylindrical pellet 320 is molded onto first cooling tube 310 which is used as a support member as well as the cooling tube for cooling a bottom surface 323 of the compacted cylindrical pellet 320 during physical vapor deposition and is located co-axially at the center of the compacted cylindrical pellet 320. The first cooling tube 310 is closed at one end for ease of water or coolant circulation. A second cooling tube 330 is placed concentrically within the first cooling tube 310 as an inlet for the coolant while the first cooling tube 310 is used as an outlet for the coolant. The coolant is introduced through the second cooling tube 330 as shown by an arrow 332 and the coolant exits through the first cooling tube 310 as indicated by an arrow 312. The compacted cylindrical pellet 320 is rotated along its axis to expose a certain surface area from a top surface 322 of the compacted cylindrical pellet 320 to a heating filament 340 in order to sublime the organic material and deposit on a substrate spaced apart from the evaporation source 300. The first cooling tube 310, on which the compacted cylindrical pellet 320 is molded onto, is attached to a rotating shaft (not shown) so that the compacted cylindrical pellet 320 can be rotated manually or with an electric motor. The heating element 340 is a single or plurality of electrically conductive wire or wires or a rod or a flat bar made from tantalum, tungsten or molybdenum metal and energized by high amperage DC current source (FIG. 5). The compacted cylindrical pellet 320 including the first cooling tube 310 and the second cooling tube 330 can be rotated at a specific rate of revolution about their common axis so that a fresh top surface 322 can be exposed to the heating element 340 at a given instant while the bottom surface 323 is cooled and maintained a temperature difference of at least 100° C. between the top surface 322 and the bottom surface 323 during the physical vapor deposition process. The organic vapor is allowed to escape through openings 362 of a lid 360 which encloses the receptacle 350. Rotation of the compacted cylindrical pellet permits collection of non-sublimable thermally insulating inorganic material to collect in a tray 370 located inside the receptacle 350.

FIG. 4 shows a cross-sectional end view of the evaporation source 300, wherein the compacted cylindrical pellet 320 is nested inside the receptacle 350 as described hereinbefore. An arrow 324 indicates the direction of rotation for the compacted cylindrical pellet 320 which enables collection of debris 372 in the tray 370. The debris 372 includes primarily non-sublimable thermally insulating inorganic material and some unused organic material.

Referring to FIG. 5, there is shown a schematic of the physical vapor deposition chamber 500 for OLED displays including a bell jar 510 which is kept under ultra high vacuum, wherein a solid compacted pellet 520 of organic material is placed inside a receptacle 530 located on the base plate 540 of the physical vapor deposition chamber 500. For the sake of simplicity, a simple evaporation source 550 including the solid compacted pellet of organic material 520, the receptacle 530, a heater 560 and a baffle 562, is connected to a DC power supply 570 for providing electrical energy in order to evaporate or sublime the solid compacted pellet of organic material 520. The heater 560 and the baffle 562 are constructed using refractory and electrically conductive metals like Ta, Mo or W. The heater 560 is provided with a series of openings 564 in the form of a hole or a slit to permit organic vapor to escape from the evaporation source 550 for deposition on a suitable receiving substrate 572 which is anchored to a fixture spaced apart from the evaporation source 550. The substrate 572 is equipped with a rotatable shutter 574 to protect it from deposition of any unwanted vapor on to the substrate 572. A thickness controller 580 located outside the bell jar 510 controls the rate of vapor deposition on the substrate 572. A crystal 582 is placed in close proximity to the substrate 572 to measure accurately the rate of vapor deposition on to the substrate 572 wherein the crystal 582 is electrically connected to the thickness controller 580 which monitors the rate of vapor deposition from the solid compacted pellet of organic material 520.

In accordance with the present invention, emission layers in an OLED display can be deposited using a compacted cylindrical pellet 320 of organic material, wherein the emission layer is formed by the steps comprising:

(a) providing a compacted cylindrical pellet of organic material including a mixture of at least one host and one dopant along with non-sublimable and thermally insulating inorganic material;

(b) placing such a compacted cylindrical pellet inside a receptacle disposed in a physical vapor deposition chamber;

(c) positioning a substrate of a partially formed OLED device in the physical deposition chamber in a spaced relationship with respect to the receptacle;

(d) evacuating the chamber to a reduced pressure;

(e) applying heat to a surface of the compacted cylindrical pellet of organic material by electrically energizing the heater disposed in the evaporation source to cause at least a portion to sublime to provide a mixture of vapors of the organic materials including the host and the dopant(s) to form an emission layer on the substrate; and (f) rotating the compacted cylindrical pellet after a certain instant in order to expose a fresh portion of organic materials on the pellet to the heater and discarding the non-sublimable thermally insulating inorganic material during the process of rotation.

The term "dopant" will be understood to include emissive dyes which are well known in the OLED art. The term "host" is also well known in the OLED art. For example see commonly assigned U.S. Pat. Nos. 4,539,507; 4,720,432 and 4,769,292. Examples of thermally insulating and non-sublimable inorganic materials are zirconia, alumina, silica, titania or magnesia or mixtures thereof.

Figure 6:
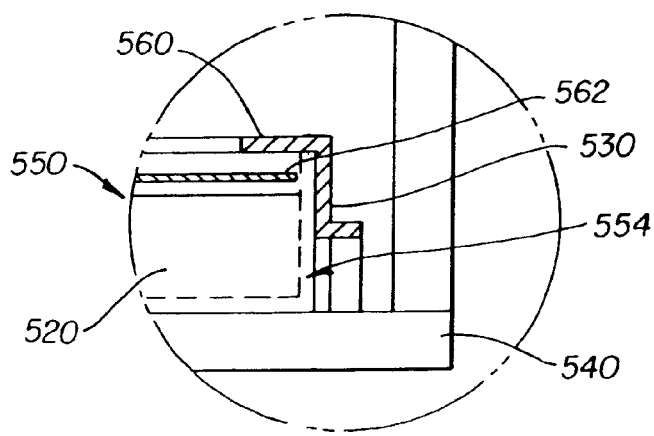
FIG. 6 an enlarged cross-sectional view of the evaporation source of FIG. 5.

FIG. 6 is a partial enlarged view of the evaporation source 550 which is a part of the vapor deposition chamber 500 as shown in FIG. 5. The evaporation source 550 includes the solid compacted pellet 520 of organic material, the heater 560, the baffle 562, and the receptacle 530. The receptacle is made from electrically insulating and high temperature resistant materials like quartz or ceramic materials like alumina, zirconia, mullite or boron nitride. The heater 560 is anchored to an electrically insulating standoff 554. The geometry and size of the solid compacted pellet generally depends on the application. While a relatively simple crucible source 550 is shown in FIG. 5 for illustrative purposes, it will be appreciated that numerous other source configurations can be effectively used to provide evaporated or sublimed vapors of organic materials within a deposition zone. For depositing HTL and ETL from a solid compacted pellet comprising a single organic material, a simple rectangular shape having flat surfaces is adequate. For depositing EML, it is preferred to select a rotary compacted cylindrical pellet comprising at least one host and one dopant of organic materials being mixed with non-sublimable thermally insulating inorganic material.

The invention has been described in detail with particular reference to certain preferred embodiments thereof, but it will be understood that variations and modifications can be effected within the spirit and scope of the invention.

PARTS LIST

100 OLED
121 substrate
122 anode
123 hole injection layer
124 hole transport layer (HTL)
125 emission layer (EML)
126 electron transport layer (ETL)
127 cathode
200 uniaxial press
221 interior surface
212 fixed platform
214 movable platform
216 post
220 die
222 lower punch
223 surface
224 upper punch
225 surface
226 die cavity
230 heating coil
240 cooling coil
250 pellet plunger
260 compliant container
300 evaporation source
310 first cooling tube
312 arrow
313a organic material
313b fill level
313p solid pellet Parts List cont'd
320 compacted cylindrical pellet
322 top surface
323 bottom surface
324 arrow
330 second cooling tube
332 arrow
340 heating element
350 refractory receptacle
360 lid
362 opening
370 tray
372 debris
500 vapor deposition chamber
510 bell jar
520 solid compacted pellet
530 receptacle
540 base plate
550 evaporation source
554 standoff
560 heater
562 baffle
564 opening
570 DC power supply
572 substrate
574 rotatable shutter
580 thickness controller
582 crystal

What is claimed is:

1. A method of making an OLED display wherein emission layer is deposited using a compacted cylindrical pellet of organic materials comprising:

(a) providing a compacted cylindrical pellet comprising (i) organic materials comprising one host and one dopant and (ii) a thermally insulating inorganic material that sublimes at a temperature higher than the temperature at which the organic materials sublime;

(b) placing the compacted cylindrical pellet inside a receptacle disposed in a physical vapor deposition chamber;

(c) positioning a substrate of a partially formed OLED device in the physical deposition chamber in a spaced relationship with respect to the receptacle;

(d) evacuating the chamber to a reduced pressure;

(e) applying heat to a surface of the compacted cylindrical pellet of organic material by electrically energizing a heater disposed in an evaporation source to cause at least a portion to sublime to provide a mixture of vapors of the organic materials including the host and the dopant(s) to form an emission layer on the substrate; and (f) rotating the compacted cylindrical pellet in order to expose a fresh portion of the organic materials on the pellet to the heater and discarding the non-sublimable thermally insulating inorganic material during the process of rotation.

2. The method of claim 1 wherein the thermally insulating and inorganic material includes:

(g) zirconia; or
(h) alumina, or
(i) silica, or
(j) titania, or
(k) magnesia, or mixtures thereof.

3. A method of making an organic layer in an OLED device using compacted pellets comprising:

(a) providing a compacted cylindrical pellet comprising
  (i) organic materials comprising one host and one dopant and (ii) a thermally insulating inorganic material that sublimes at a temperature higher than the temperature at which the organic materials sublime;
(b) subliming the organic materials and not the thermally insulating inorganic material from the top surface of the compacted cylindrical pellet and maintaining the bottom surface of the compacted cylindrical pellet at a lower temperature than the top surface with the temperature difference between the top and bottom surfaces being at least 1000° C. to form the organic layer.

4. The method of claim 3 further including the step of cooling the bottom surface of the compacted cylindrical pellet.

* * * * *

UNITED STATES PATENT AND TRADEMARK OFFICE
CERTIFICATE OF CORRECTION

| | |
|---|---|
| PATENT NO. | : 7,238,383 B2 |
| APPLICATION NO. | : 10/384290 |
| DATED | : July 3, 2007 |
| INVENTOR(S) | : Syamal K. Ghosh et al. |

It is certified that error appears in the above-identified patent and that said Letters Patent is hereby corrected as shown below:

Column 12, Line 11    Please replace the text "at least 1000° C." with the following corrected text --at least 100° C.--

Signed and Sealed this

Eleventh Day of March, 2008

JON W. DUDAS
*Director of the United States Patent and Trademark Office*